United States Patent [19]

Holden

[11] 4,374,361

[45] Feb. 15, 1983

[54] CLOCK FAILURE MONITOR CIRCUIT EMPLOYING COUNTER PAIR TO INDICATE CLOCK FAILURE WITHIN TWO PULSES

[75] Inventor: James R. Holden, Chicago, Ill.

[73] Assignee: GTE Automatic Electric Labs Inc., Northlake, Ill.

[21] Appl. No.: 220,933

[22] Filed: Dec. 29, 1980

[51] Int. Cl.³ .................... H03K 13/32; H03K 17/296
[52] U.S. Cl. .................................... 328/120; 307/518; 307/608
[58] Field of Search ................ 307/518, 608; 328/129, 328/119, 120

[56] References Cited

U.S. PATENT DOCUMENTS

| | | | |
|---|---|---|---|
| 3,350,580 | 10/1967 | Harrison | 307/608 X |
| 3,582,795 | 6/1971 | Heick | 307/608 X |
| 3,936,745 | 2/1976 | Harrington | 328/129 X |
| 4,023,109 | 5/1977 | Shreve | 307/518 X |
| 4,052,676 | 10/1977 | Crittenden | 328/129 X |

Primary Examiner—John S. Heyman
Attorney, Agent, or Firm—Robert J. Black; Gregory G. Hendricks

[57] ABSTRACT

A monitor circuit, for use in a switching system which detects pulse failures through use of a pair of timing counters. A flip-flop enables and clears each counter alternately in response to detection of the monitored pulse.

8 Claims, 1 Drawing Figure

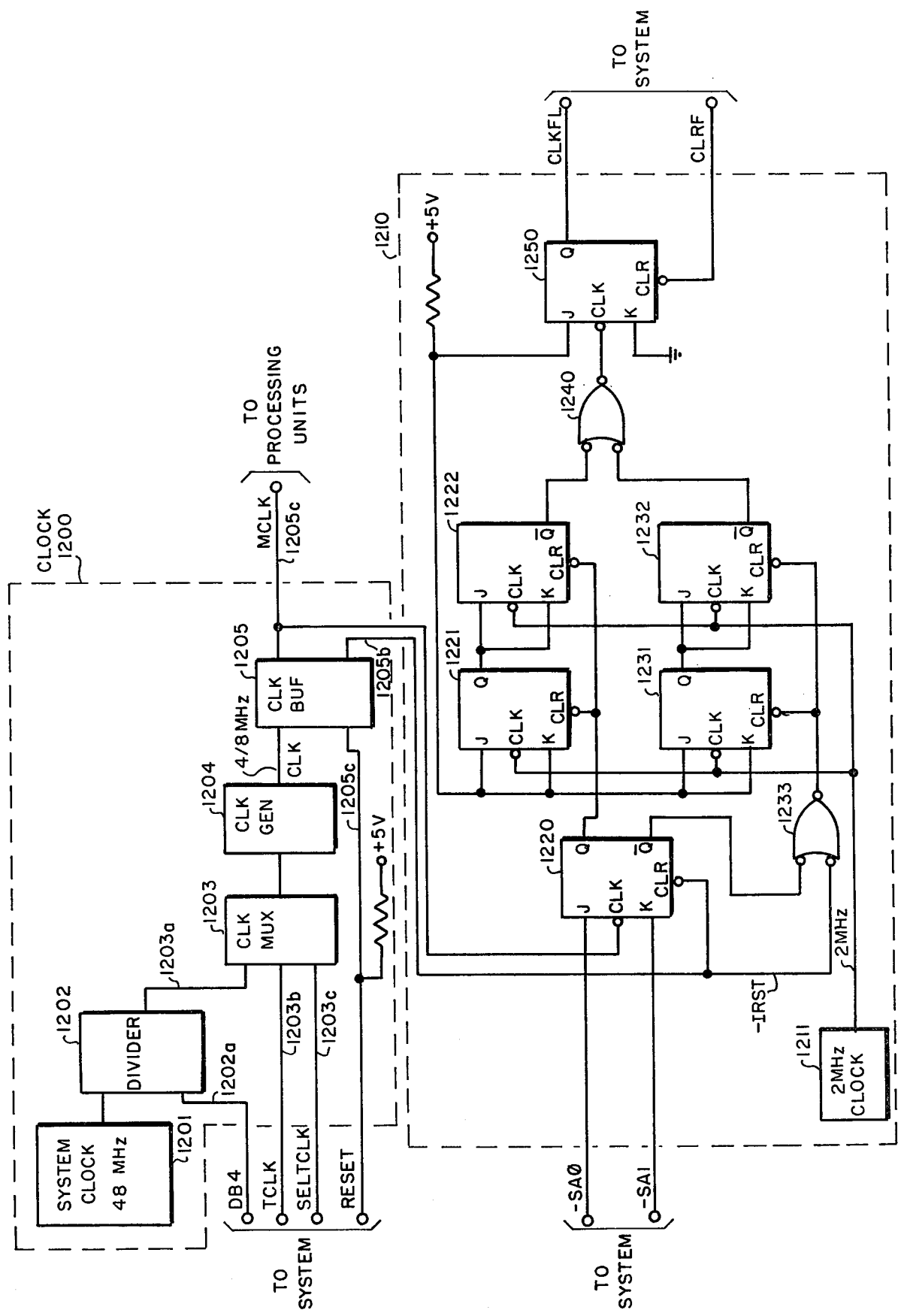

CLOCK FAILURE MONITOR CIRCUIT EMPLOYING COUNTER PAIR TO INDICATE CLOCK FAILURE WITHIN TWO PULSES

BACKGROUND OF THE INVENTION (1) Field of the Invention

The present invention relates to switching systems and more particularly to a pulse monitor circuit for use in switching systems.

(2) Description of the Prior Art

Current state-of-the-art pulse monitor circuits use retriggerable monostable unit multivibrators. These circuits are designed to operate with the time-out period of the multivibrator set to a time slightly longer than the time between consecutive pulses. Therefore, a missing pulse causes the monostable multivibrator to time-out and an alarm is set. However, retriggerable monostable multivibrators have poor timing tolerances and a low degree of repeatability.

Accordingly it is the object of the present invention to provide a highly reliable low tolerance digital pulse monitor.

SUMMARY OF THE INVENTION

The present invention is a circuit which monitors the expected time intervals between monitored pulses. A flip-flop toggles in response to detection of a clock pulse and alternately generates a clear signal on each of two outputs. Two counters are connected to the flip-flop and each is cleared in response to an associated clear signal. Both counters are also connected to a reference clock. Each counter counts clock pulses from the reference clock and if a monitored clock pulse doesn't arrive and cause a clear signal to be generated before the counter times-out an alarm is set. Thus a race condition exists with the counters timing out unless a monitored pulse is detected before a predetermined number of reference clock pulses are counted.

DESCRIPTION OF THE DRAWING

The single FIGURE of the accompanying drawing is a logic diagram of a pulse monitor in accordance with the present invention.

DESCRIPTION OF THE PREFERRED EMBODIMENT

Referring now to the accompanying drawing, the clock pulse monitor circit 1210 of the present invention is shown. This circuit comprises two ranks of monitoring flip-flops. The upper rank consists of flip-flops 1221 and 1222 while the lower rank consists of flip-flops 1231 and 1232. The monitoring process involves setting up a race condition between the clock to be monitored and a predetermined time out controlled by a separate 2 MHz clock 1211 which drives the lower and upper ranks of flip-flops. Thus if either the lower or upper rank of monitor flip-flops counts two internal clock pulses before an external clock pulse appears from the monitored clock, output flip-flop 1250 will generate a clock failure signal.

In this preferred embodiment a clock monitor circuit is arranged to be able to monitor either a 8 MHz, 4 MHz or test clock. The system clock 1201 generates a 48 MHz clock signal which is normally divided by divider 1202 into a 24 MHz clock signal. However in the event that a logic level 1 divide-by-4 (DB4) signal appears on lead 1202a, divider 1202 divides the system clock by 4 thereby providing a 12 MHz clock signal. Clock multiplex 1203 is shown connected to divider 1202 and to the system via leads 1203b and c. The 12/24 MHz clock signal is normally gated by clock multiplex 1203 to clock generator 1204. However if the external system selects the test clock by providing a logic level 1 select test clock (SELTCLK) signal on lead 1203c then an external test clock generator connected to lead 1203b is gated to clock generator 1204 by clock multiplex 1203. Clock generator 1203 further divides its input clock signal by 3 which, except for the case of the test clock signal, results in a 4 or 8 MHz signal appearing at the clock input to clock buffer 1205. Clock buffer 1205 thus generates a master clock signal to the processing units on lead 1205c. Clock buffer 1205 is also shown connected to reset lead 1205a. If the logic level 0 reset signal is applied to lead 1205a clock buffer 1205 generates a logic level 0 internal reset (IRST) signal on lead 1205b.

Clock circuit 1200 is shown connected to clock monitor circuit 1210 via master clock lead 1205C and internal reset lead 1205B. Clock monitor circuit 1210 includes input flip-flop 1220 whose clock lead is shown connected to clock buffer 1205 via lead 1205C. Two MHz reference clock 1211 is shown connected to the clock input of flip-flops 1221, 1222, 1231 and 1232. The J and K inputs of flip-flops 1221 and 1231 are shown connected to a plus 5 volt power supply while the J and K inputs of flip-flops 1222 and 1232 are shown connected to the Q output of flip-flops 1221 and 1231 respectively. The inputs to gate 1240 are shown connected to the $\overline{Q}$ outputs of gates 1222 and 1232 while the output of gate 1240 is shown connected to the clock input of output flip-flop 1250. The Q output of this flip-flop indicated clock failure to the system via the gate circuit.

When the clock monitor is initially cleared by a logic level 0 internal reset (−IRST) signal on lead 1205b, input flip-flop 1220 and monitor flip-flops 1231 and 1232 are reset. Since the Q output of input flip-flop 1220 is therefore at a logic level 0, it holds flip-flops 1221 and 1222 in the reset condition thereby causing a logic level 1 signal on the $\overline{Q}$ output of flip-flop 1222. When the −IRST signal is returned to logic 1, flip-flops 1231, 1232 and 1221, 1222 are free to operate in response to clock pulses from 2 MHz reference clock 1211. Since the J and K inputs of flip-flops 1231 are at a logic level 1 state, this flip-flop clocks a logic level 1 signal to its Q output on a falling edge of the first clock pulse. Since the Q output of flip-flop 1231 appears at the J and K inputs of flip-flop 1232 this flip-flop clocks a logic level 0 signal to its $\overline{Q}$ output on the trailing edge of the second clock pulse. This logic level 0 output signal is transferred by gate 1240 to the clock input of output flip-flop 1250 causing it to clock the logic level 1 signal on its J input to its Q output thereby generating the clock failure signal.

However this clock failure signal is not generated if the trailing edge of a master clock signal appears at the clock input of input flip-flop 1220 before the trailing edge of the second clock pulse from reference clock 1211. In this case input flip-flop 1220 toggles causing its $\overline{Q}$ output to have a logic level 1 signal and its Q output to have a logic level 0 signal. This logic level 0 signal is transferred by gate 1233 to the clear input of flip-flops 1231 and 1232, thereby causing them to reset and preventing generation of the clock failure signal. Thus the monitor process operates under a race condition whereby the clock failure signal is generated within 2 clock pulses of the reference clock unless a falling edge of the master clock signal occurs before the falling edge of the second reference clock pulse.

When input flip-flop 1220 was clocked to cause a logic level 1 signal to appear on its Q output that also removed the clear condition from flip-flops 1221 and 1222. These flip-flops are then free to operate in response to 2 MHz reference clock 1211. In a manner similar to flip-flops 1231 and 1232, flip-flops 1221 and 1222 cause a logic level 0 signal to appear at gate 1240 after the failing edge of a second clock pulse thereby causing a clock failure signal. However if a master clock pulse appears at the clock input of input flip-flop 1220 it again toggles causing a logic level 0 signal to appear at its Q output thereby clearing flip-flops 1221 and 1222 and removing the source of the clock failure signal.

This monitor circuit can be routined by the processing unit by placing a logic level 0 signal on either the stuck-at-0 (SA0) lead connected to the J input of input flip-flop 1220 or the stuck-at-1 (SA1) input connected to the K input of flip-flop 1220. This circuit is routined by placing it in such condition as to allow it to count to the alarm condition. For example, if a logic level 0 is placed on the stuck-at-0 input, flip-flop 1220 clocks a logic level 0 signal to its Q output thereby clearing flip-flops 1221 and 1222 and allowing flip-flops 1231 and 1232 to count in response to 2 MHz reference clock. However as long as the stuck-at-0 signal is applied to flip-flop 1220 any master clock pulses appearing at the clock input of this flip-flop do not cause flip-flop 1220 to toggle thus preventing flip-flops 1231 and 1232 from resetting. Therefore these flip-flops count up to the clock failure time-out condition and generate the clock failure signal. In this manner the failure detection operation of the clock monitor circuiit can be verified.

Similarly, by placing a logic level 0 signal on the stuck-at-1 input, flip-flop 1220 clocks a logic level 0 signal to its $\overline{Q}$ output thereby resetting flip-flops 1231, 1232 and allowing flip-flops 1221 and 1222 to count in response to 2 MHz reference clock 1211. Again, in this condition, flip-flops 1221 and 1222 count to their clock failure time out count since the stuck-at-1 signal prevents flip-flop 1220 from toggling in response to a master clock signal. As a result flip-flops 1221 and 1222 are prevented from being cleared before they time out.

Thus the clock monitor circuit generates a clock failure alarm if the master clock signal does not appear within 2 negative going edges of the reference clock signal. Since a 2 MHz reference clock signal was choosen it has a period of 500 nanoseconds. Therefore two complete clock pulses take 1 microsecond. The normal arrangement of clock circuit 1200 provides an 8 MHz master clock signal which has a 125 nanosecond period. Thus this monitor circuit detect a clock failure if a clock pulse does not appear within the time allowed for 8 master clock pulses.

By adjusting the frequency of the reference clock and the number of flip-flops in the upper and lower ranks of monitor flip-flops, the monitor circuit can be tuned to any desired accuracy including detection of the absence of 1 master clock pulse.

It will be obvious to those skilled in the art that numerous modifications of the present invention can be made without departing from the spirit of the invention which shall be limited only by the scope of the claims appended hereto.

What is claimed is:

1. A pulse monitor circuit for use in a switching system, said pulse monitor comprising:
   a first source of periodic pulses;
   a second source of periodic pulses;
   input storage means connected to said first pulse source, operated in response to each of a first group of alternately occurring pulses from said first pulse source to generate a first clear signal, said input storage means further operated in response to each of a second group of alternately occurring pulses from said first pulse source to generate a second clear signal;
   a first counter circuit connected to said input storage means and said second pulse source, operated in response to an absence of said first clear signal to count pulses from said second pulse source;
   a second counter circuit connected to said input storage means and said second pulse source, operated in response to an absence of said second clear signal to count pulses from said second pulse source; and
   output storage means connected to said first and second counter circuits, operated in response to a predetermined count from said first or second counter circuits to generate a pulse failure signal.

2. A pulse monitor circuit as claimed in claim 1, wherein: said first counter circuit is further operated in response to said first clear signal to prevent counting pulses from said second pulse source and said second counter circuit is further operated in response to said second clear signal to prevent counting pulses from said second pulse source.

3. A pulse monitor circuit is claimed in claim 1, wherein said input storage means comprise a toggle flip-flop.

4. A pulse monitor circuit as claimed in claim 3, wherein this is further included: a logic level 0 signal source, said flip-flop comprising a J-K flip-flop having first and second inputs connectable to said logic level 0 signal source, said J-K flip-flop operated in response to a logic level 0 signal on its first input to generate said first clear signal, said J-K flip-flop further operated in response to a logic level 0 on its second input to generate said second clear signal.

5. A pulse monitor circuit as claimed in claim 1, wherein there is further included gating means having first and second inputs, said first input connected to said input storage means and the second input connectable to ground, said gating means operated in response to either a clear signal from said input storage means or a ground signal, to apply a clear signal to a connected counter circuit.

6. A pulse monitor circuit is claimed in claim 1, wherein said output storage means comprise a gating circuit connected to said first and second counter circuits, and a flip-flop connected to said gating circuit, said gating circuit operated in response to said first or second predetermined count to generate a trigger signal; said flip-flop operated in response to said trigger signal to generate said pulse failure signal.

7. A pulse monitor as claimed in claim 6, wherein: said flip-flop comprises a J-K flip-flop having first, second and clock inputs, said first input connected to a first bias supply said second input connected to a second bias supply and said clock input connected to said gating circuit.

8. A pulse monitor circuit as claimed in claim 1 wherein: said first and second counter circuits comprise a plurality of flip-flops.

* * * * *